United States Patent
Hu et al.

(10) Patent No.: US 9,159,788 B2
(45) Date of Patent: Oct. 13, 2015

(54) NITRIDE SEMICONDUCTOR STRUCTURE

(71) Applicant: Industrial Technology Research Institute, Hsinchu (TW)

(72) Inventors: Chih-Wei Hu, Taoyuan County (TW); Chen-Zi Liao, Nantou County (TW); Hsun-Chih Liu, Taipei (TW); Rong Xuan, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/144,566

(22) Filed: Dec. 31, 2013

(65) Prior Publication Data

US 2015/0187876 A1    Jul. 2, 2015

(51) Int. Cl.
*H01L 31/0256* (2006.01)
*H01L 29/06* (2006.01)
*H01L 29/267* (2006.01)
*H01L 29/32* (2006.01)

(52) U.S. Cl.
CPC .......... *H01L 29/0688* (2013.01); *H01L 29/267* (2013.01); *H01L 29/32* (2013.01)

(58) Field of Classification Search
CPC ............ H01L 31/0256; H01L 33/0073; H01L 29/2003; H01L 21/0254
USPC .................. 257/76, 95, 190; 438/29
See application file for complete search history.

(56) References Cited

U.S. PATENT DOCUMENTS

| | | | |
|---|---|---|---|
| 7,687,814 B2 | 3/2010 | Choi et al. | |
| 2009/0078961 A1 | 3/2009 | Choi | |
| 2011/0108800 A1 | 5/2011 | Pan | |
| 2012/0126239 A1 | 5/2012 | Keller et al. | |
| 2012/0313076 A1 | 12/2012 | Nakamura et al. | |
| 2012/0320642 A1* | 12/2012 | Imanishi | 363/37 |
| 2013/0200495 A1* | 8/2013 | Keller et al. | 257/615 |
| 2014/0061665 A1* | 3/2014 | Tsuchiya | 257/76 |
| 2014/0124804 A1* | 5/2014 | Jeon et al. | 257/95 |
| 2014/0124833 A1* | 5/2014 | Fang et al. | 257/190 |

FOREIGN PATENT DOCUMENTS

| | | |
|---|---|---|
| CN | 102598316 | 7/2012 |
| KR | 2009108675 | 10/2009 |

(Continued)

OTHER PUBLICATIONS

Srinivasan Raghavan and Joan M. Redwing, "Growth stresses and cracking in GaN films on (111) Si grown by metalorganic chemical-vapor deposition. I. AlN buffer layers," Journal of Applied Physics, Jul. 22, 2005, pp. 1-10.

(Continued)

*Primary Examiner* — Phuc Dang
(74) *Attorney, Agent, or Firm* — Jianq Chyun IP Office

(57) ABSTRACT

A nitride semiconductor structure including a silicon substrate, a nucleation layer, a buffer layer and a nitride semiconductor layer is provided. The nucleation layer is disposed on the silicon substrate. The buffer layer is disposed on the nucleation layer, in which the buffer layer includes n sub-buffer layers where n≥2, and each of the sub-buffer layers has island structures. The nitride semiconductor layer is disposed on the buffer layer.

14 Claims, 7 Drawing Sheets

(56) References Cited

FOREIGN PATENT DOCUMENTS

| | | |
|---|---|---|
| TW | 398084 | 7/2000 |
| TW | 201101486 | 1/2011 |
| TW | 201415628 | 4/2014 |
| WO | 2007103419 A3 | 5/2008 |

OTHER PUBLICATIONS

M Haeberlen et al., "Dislocation reduction in MOVPE grown GaN layers on (111)Si using SiNx and AlGaN layers," Journal of Physics: Conference Series, Jun. 30, 2010, pp. 1-4.

Chih-Wei Hu et al., "Nitride Semiconductor Structure", Unpublished U.S. Appl. No. 14/049,209, filed Oct. 9, 2013.

* cited by examiner

NITRIDE SEMICONDUCTOR STRUCTURE

TECHNICAL FIELD

The disclosure relates to a nitride semiconductor structure, and more particularly, to a nitride semiconductor structure that includes the island structures in the buffer layer.

BACKGROUND

Nowadays, it has been proved that gallium nitride-based (GaN-based) semiconductor material has potential for the commercial applications such as the backlight module of LCD, optical storage system, high frequency and high power microwave electronic device, where sapphire substrate is mainly used as substrate for the epitaxial growth of GaN-based semiconductor material. However, the fabrication cost of nitride light-emitting diodes is much higher than other illuminating devices, and sapphire substrates for growth of nitride have shortcomings such as poor thermal conductivity which seriously affects the lifespan of the nitride light-emitting diodes. Therefore, replacing the current sapphire substrate with a lower-cost and high thermal conductive substrate is suggested. Due to several advantages of silicon substrates such as high thermal conductivity, high electrical conductivity, ability to be cut easily and low cost, light-emitting diode fabricated over a silicon substrate is developed in recent years.

Nevertheless, production yield rate of large-sized nitride semiconductor structures fabricated over silicon substrates is low, it is difficult to significantly lower the cost of the devices accordingly. The main factor for affecting the yield rate of large-sized nitride semiconductor structures is thermal expansion mismatch and lattice mismatch between the nitride semiconductor layer and the silicon substrate. Thermal expansion mismatch and lattice mismatch between the nitride semiconductor layer and the silicon substrate cause difficulty in stress release and increase defect density, and thus it may cause the nitride semiconductor structures to have considerable cracks and tensile stress. In other words, the nitride semiconductor structures may crack easily. Moreover, the chip bonding equipment and the laser ablation equipment utilized to lift-off substrate are expensive, and the yield rate of the chip bonding process and the laser ablation process is low. Therefore, how to form a GaN epitaxy structure on a silicon substrate to significantly enhance the yield rate of the chip bonding process without the use of laser ablation, becomes an essential topic in the field.

SUMMARY

The disclosure is directed to a nitride semiconductor structure, which reduces stresses in the nitride semiconductor structure so as to decrease the probability of cracks occurring in the nitride semiconductor structure.

The disclosure provides a nitride semiconductor structure, which includes a silicon substrate, a nucleation layer, a buffer layer and a nitride semiconductor layer. The nucleation layer is disposed on the silicon substrate. The buffer layer is disposed on the nucleation layer, in which the buffer layer comprises n sub-buffer layers where n≥2, and each of the sub-buffer layers has island structures. The nitride semiconductor layer is disposed on the buffer layer.

To recapitulate, in the nitride semiconductor structure according to the embodiments of the disclosure, by having the roughness of the sub-buffer layers in the buffer layer satisfying a specific relationship, or by having the heights and/or the distribution densities of the island structures in the sub-buffer layers of the buffer layer satisfying specific relationships, together with the buffer layer being a graded AlGaN layer having step graded aluminum content or continuously graded aluminum content, the stresses resulted from thermal expansion mismatch (i.e. difference between the coefficients of thermal expansion) can be effectively reduced between the nitride semiconductor layer and the silicon substrate. Moreover, the nitride semiconductor structure of the disclosure can avoid tedious processes such as laser ablation, which improves the yield rate of large-sized nitride semiconductor structures with no cracks.

Several exemplary embodiments accompanied with figures are described in detail below to further describe the disclosure in details.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DETAILED DESCRIPTION OF DISCLOSED EMBODIMENTS

The disclosure provides a nitride semiconductor structure which can reduce the stress caused by thermal expansion mismatch and lattice mismatch between the nitride semiconductor layer and the silicon substrate, thus reducing probability of cracks. Moreover, tedious processes such as laser ablation are not needed, which effectively improves the yield rate of large-sized nitride semiconductor structures with no cracks.

Figure 1:
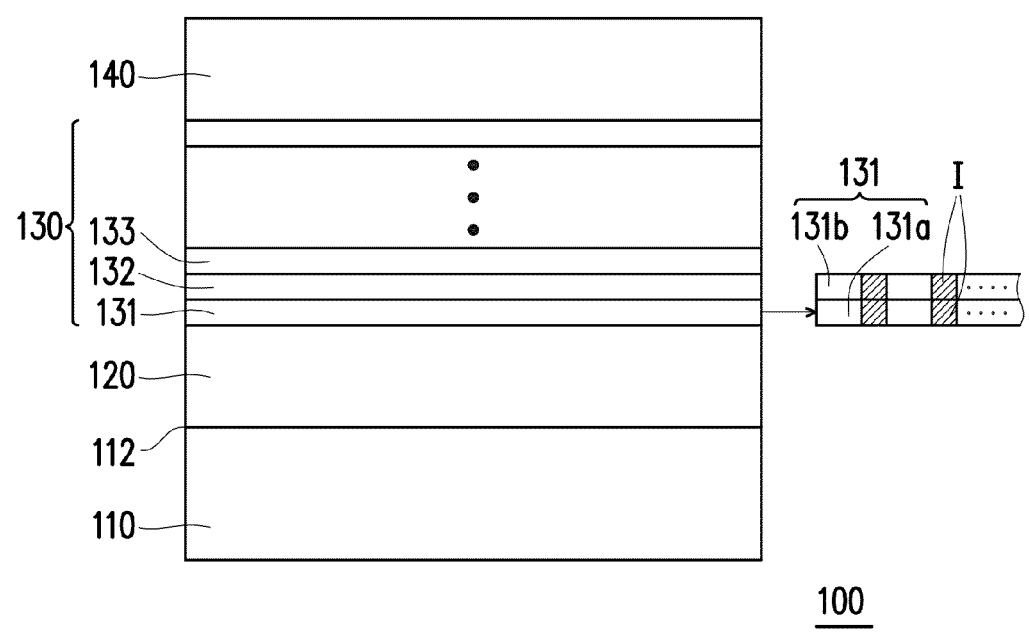
FIG. 1 is a schematic diagram illustrating a nitride semiconductor structure according to an exemplary embodiment.

FIG. 1 is a schematic diagram illustrating a nitride semiconductor structure according to an exemplary embodiment. Referring to FIG. 1, a nitride semiconductor structure 100 in the embodiment includes a substrate 110, a nucleation layer 120, a buffer layer 130 and a nitride semiconductor layer 140. The substrate 110 may be an aluminum oxide ($Al_2O_3$) substrate, a glass substrate or a silicon substrate, for instance, where the silicon substrate is employed for illustration in the disclosure. The nucleation layer 120 is disposed on the silicon substrate 110, in which the nucleation layer 120 may be an aluminum nitride (AlN) layer or an aluminum gallium nitride (AlGaN) or a cubic silicon carbon nitride ($Si_xC_yN_z$) layer (the parameters x, y and z satisfy the equation: x=y+z, where z is less than 0.3), for instance, where the aluminum nitride layer is employed for illustration in the disclosure. Next, the buffer layer 130 is disposed on the nucleation layer 120, and afterwards the nitride semiconductor layer 140 is disposed on the buffer layer 130. The nitride semiconductor layer 140 may be a gallium nitride (GaN) layer, for instance. In the embodiment, the nucleation layer 120, the buffer layer 130 and the nitride semiconductor layer 140 are respectively deposited on the silicon substrate 110 by metal organic chemical vapor disposition (MOCVD). However, the fabricating methods of the nucleation layer 120, the buffer layer 130 and the nitride semiconductor layer 140 formed on the silicon substrate 110 are not limited to metal organic chemical vapor deposition (MOCVD).

As shown in FIG. 1, the buffer layer 130 includes n layers of nitride layers, that is, n sub-buffer layers where n≥2, and each of the sub-buffer layers has island structures I. Specifically, the buffer layer 130, counting from the nucleation layer 120, sequentially comprises a first sub-buffer layer 131, a second sub-buffer layer 132 . . . , and an $n^{th}$ sub-buffer layer, and a distribution of the island structures I (e.g. the surface roughness) in the first sub-buffer layer 131 is graded to a distribution of the island structures I in the $n^{th}$ sub-buffer layer. In other words, different sub-buffer layers may have island structures in various forms. For instance, the heights or the distribution densities of the island structures in the sub-buffer layers can be different from each other, such that each of the sub-buffer layers has a different roughness.

Figure 2A:
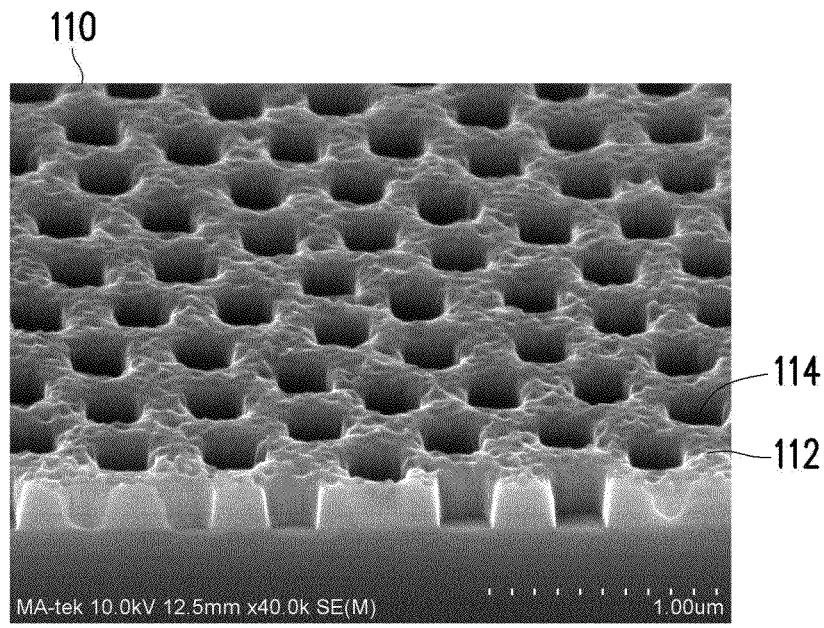
FIG. 2A is a scanning electron microscope (SEM) image illustrating a patterned silicon substrate which a silicon carbon nitride (SixCyNz) layer is applied onto.
Figure 2B:
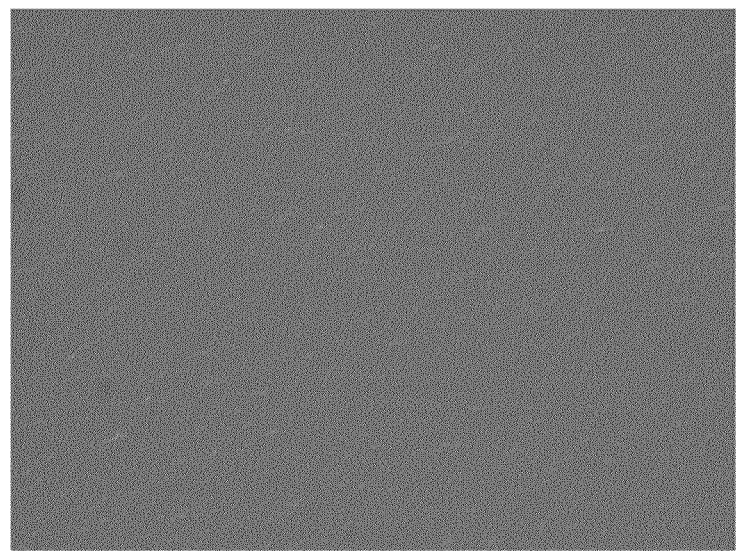
FIG. 2B is an optical microscope (OM) image illustrating a surface of a nitride semiconductor layer of the nitride semiconductor structure after the nitride semiconductor layer being epitaxially grown on the patterned silicon substrate depicted in FIG. 2A.

FIG. 2A is a scanning electron microscope (SEM) image illustrating a patterned silicon substrate. FIG. 2B is an optical microscope (OM) image illustrating a surface of a nitride semiconductor layer of the nitride semiconductor structure after the nitride semiconductor layer being epitaxially grown on the patterned silicon substrate depicted in FIG. 2A. Referring to FIG. 2A and FIG. 1, the silicon substrate 110 includes a surface 112 to be contacted with the nucleation layer 120 and a plurality of cavities 114, where the cavities 114 are concave on the surface 112, so that the nucleation layer 120 and the buffer layer 130 respectively formed on the silicon substrate 110 may grow laterally at the cavities. In other words, the silicon carbon nitride ($Si_xC_yN_z$) layer, that is, the nucleation layer 120, can be applied to a patterned silicon substrate for epitaxial growth. When the nitride semiconductor structure 100 is utilized to fabricate light-emitting diode devices, a plurality of voids formed by the cavities 114 exist between the nucleation layer 120 and the silicon substrate 110, which may be helpful to release stresses.

As shown in FIG. 2B, under the silicon substrate 110 with the voids thereon, the surface of the nitride semiconductor layer 140 appears to be crack free. In other words, the stress resulted from thermal expansion mismatch and lattice mismatch is reduced between the nitride semiconductor layer 140 and the silicon substrate 110 due to the buffer layer 130 having island structures I. It should be noted that the patterned silicon substrate depicted in FIG. 2A (namely, the silicon substrate 110 having the cavities 114 thereon) is one illustration of silicon substrate, in other embodiments, the surface 112 of the silicon substrate 110 may be a flat surface (i.e., a plane silicon substrate), although the disclosure is not limited thereto.

In the embodiment, at least one of the sub-buffer layers includes a multi-layer structure, and the multi-layer structure comprises a plurality of stacked nitride layers with different lattice constants. For example, as shown in FIG. 1, the multi-layer structure of the first sub-buffer layer 131 can be formed by a plurality of aluminum gallium nitride (AlGaN) layers with two different aluminum (Al) contents 131a and 131b stacked alternately, so as to reduce the stresses resulted from thermal expansion mismatch between the nitride semiconductor layer 140 and the silicon substrate 110. To be more specific, the multi-layer structure of each sub-buffer layer can be formed by 15 pairs of AlGaN layers with two different aluminum contents stacked alternately, although the disclosure is not limited thereto.

It should be noted that the nucleation layer 120 disposed between the first sub-buffer layer 131 and the silicon substrate 110 (as shown in FIG. 1) is to prevent gallium of the first sub-buffer layer 131 to contact with silicon of the silicon substrate 110, because gallium and silicon may form eutectic substances on the surface of the silicon substrate 110 without the nucleation layer 120, which may cause difficulties for depositing on the silicon substrate 110.

Moreover, the buffer layer 130 may be regarded as a graded AlGaN layer with step graded aluminum content. Taking the buffer layer 130 includes three sub-buffer layers 131-133 shown in FIG. 1 as an example, each of the sub-buffer layers has two different aluminum contents stacked alternately, that is to say, there are six different aluminum contents stacked alternately in the buffer layer 130, such as 0.55 at %, 0.45 at %, 0.4 at %, 0.3 at %, 0.2 at %, 0.1 at %, which decreases stepwisely from the nucleation layer 120 towards the nitride semiconductor layer 140, although the disclosure is not limited thereto.

In other embodiments, the buffer layer 130 may also be regarded as a graded AlGaN layer with continuously graded aluminum content, in which the graded AlGaN layer with continuously graded aluminum content may also reduce the stresses resulted from thermal expansion mismatch and lattice mismatch between the nitride semiconductor layer 140 and the silicon substrate 110.

In other words, since the buffer layer 130 is considered to be a graded AlGaN layer with step graded aluminum content or a graded AlGaN layer with continuously graded aluminum content, the lattice constant of the first sub-buffer layer 131 close to the nucleation layer 120 may be less than the lattice constant of the third sub-buffer layer 133 close to the nitride semiconductor layer 140 (namely, the atomic radius in the third sub-buffer layer 133 is greater than the atomic radius in the first sub-buffer layer 131), so that the probability of pits or cracks occurring in the nitride semiconductor structure 100 of the embodiment can be reduced due to the stresses resulted from thermal expansion mismatch and lattice mismatch between the nitride semiconductor layer 140 and the silicon substrate 110 is lowered by the buffer layer 130, either with step graded aluminum content or with continuously graded aluminum content.

It should be noted that, in the buffer layer 130 of the nitride semiconductor structure of the disclosure, the sub-buffer layers at different locations may be designed to have different island structures. In detail, by having roughnesses of the sub-buffer layers to satisfy a certain relationship, or by having heights and/or distribution densities of the island structures in the sub-buffer layers of the buffer layer 130 to satisfy certain relationships, more voids are created between the sub-buffer layers in the buffer layer 130, and thus the tensile stresses resulted from thermal expansion mismatch between the nitride semiconductor layer 140 and the silicon substrate 110 can be released through these voids between the sub-buffer layers, thereby improving the yield rate of large-sized nitride semiconductor structures with no cracks. In particular, through depositing the island structures to form the sub-buffer layers of the buffer layer and having the buffer layer with step graded aluminum content or continuously graded aluminum content, the stresses between the nitride semiconductor layer 140 and the silicon substrate 110 can be effectively reduced and the cracks in the nitride semiconductor layer 140 can be eliminated, such that the quality of the nitride semiconductor structure is enhanced.

The impact on defect density of the nitride semiconductor structure by way of adjustment of sub-buffer layers or island structures in each sub-buffer layer in the buffer layer, as described in the disclosure, will be further described with support from the experimental results provided below. In the embodiments hereafter, the buffer layer exemplarily has three sub-buffer layers, while people skilled in the art may actively change the layer number of the sub-buffer layers in the buffer layer according to an actual device to be applied and can still implement the embodiments.

Moreover, the buffer layer (330, 430, 530) in the embodiments hereafter, counting from the nucleation layer 120, sequentially comprises a first sub-buffer layer (331, 431, 531), a second sub-buffer layer (332, 432, 532) and a third sub-buffer layer (333, 433, 533), and a composition of the sub-buffer layers comprises aluminum gallium nitride (Al$_x$Ga$_y$N, x+y=1). To be more specific, in the composition Al$_x$Ga$_y$N of the first sub-buffer layer (331, 431, 531), 0.7<x<0.3; in the composition Al$_x$Ga$_y$N of the second sub-buffer layer (332, 432, 532), 0.5<x<0.2; and in the composition Al$_x$Ga$_y$N of the third sub-buffer layer (333, 433, 533), 0.3<x<0.01. As the aluminum content decreases gradually in a direction from the first sub-buffer layer toward the third sub-buffer layer, the lattice constants of the sub-buffer layers in the buffer layer also vary, thereby decreasing the internal stress of the nitride semiconductor layer 140 which prevent the occurrence of cracks. The nitride semiconductor structure with the lattice constant variation may reduce stresses built in the epitaxy layers and improve the crystal quality.

Furthermore, in the embodiments hereafter, the nucleation layer 120, the sub-buffer layers in the buffer layer and the nitride semiconductor layer 140 in the nitride semiconductor structure may have grown to certain thicknesses, respectively. For example, the thickness of the nucleation layer 120 (e.g. the AlN layer) is between 50 nm to 500 nm. The thickness of the buffer layer is between 1 μm and 10 μm, in which a thickness of each of the sub-buffer layers can be between 0.1 μm to 3 μm, respectively. The nitride semiconductor layer 140 can be a GaN layer and the thickness of the GaN layer can be between 0.1 μm and 10 μm, for instance. Preferably, the thickness of the GaN layer is greater than 0.1 μm and less than 5 μm. As such, the overall thickness of the nitride semiconductor structure may be increased.

Figure 3:
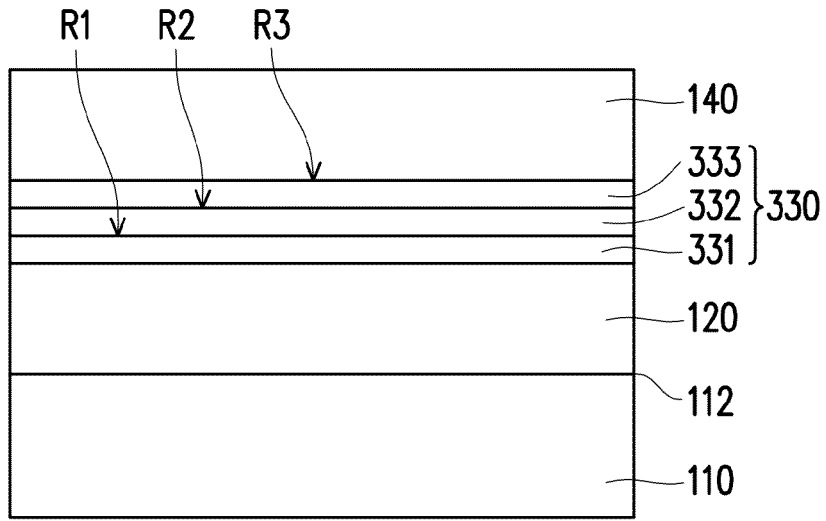
FIG. 3 is a schematic diagram illustrating a buffer layer having sub-buffer layers with different roughnesses in a nitride semiconductor structure according to an exemplary embodiment.

FIG. 3 is a schematic diagram illustrating a buffer layer having sub-buffer layers with different roughnesses in a nitride semiconductor structure according to an exemplary embodiment. Referring to FIG. 3, the nucleation layer 120, the buffer layer 330 and the nitride semiconductor layer 140 are sequentially formed on the silicon substrate 110 in the nitride semiconductor structure 300, in which the first through third sub-buffer layers 331-333 in the buffer layer 330 are deposited on the nucleation layer 120 in sequence where the third sub-buffer layer 333 is in contact with the nitride semiconductor layer 140. The island structures in each of the sub-buffer layers 331-333 are formed through different epitaxial growth rates, so that the sub-buffer layers 331-333 have various roughnesses R1, R2 and R3, respectively. In the embodiment, the roughnesses of the first through third sub-buffer layers 331-333 in the buffer layer 330 is decreased gradually in a layer thickness direction from the nucleation layer 120 toward the nitride semiconductor layer 140, namely, R1>R2>R3. In other words, in the n sub-buffer layers of the buffer layer (as shown in FIG. 1), the roughness R1 of the first sub-buffer layer 131, the roughness R2 of the second sub-buffer layer 132 and the roughness Rn of the n$^{th}$ sub-buffer layer satisfy the following equation (1):

$$R1>R2>Rn \qquad (1).$$

More specifically, the roughness R1 of the first sub-buffer layer 331 may be in a range from 10 nm to 3 nm, the roughness R2 of the second sub-buffer layer 332 may be in a range from 8 nm to 3 nm, and the roughness R3 of the third sub-buffer layer 333 may be in a range from 4 nm to 0.5 nm.

Figure 4:
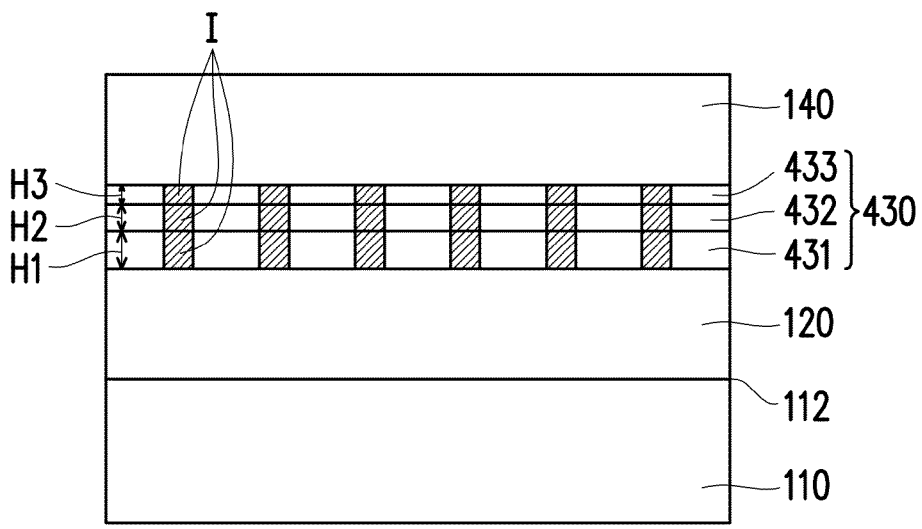
FIG. 4 is a schematic diagram illustrating a buffer layer having island structures with different heights in a nitride semiconductor structure according to an exemplary embodiment.

FIG. 4 is a schematic diagram illustrating a buffer layer having island structures with different heights in a nitride semiconductor structure according to an exemplary embodiment. In the embodiment, having heights of the island structures in the sub-buffer layers to satisfy a certain relationship can be employed to replace the technique of the graded roughnesses (i.e., R1-R3) in the sub-buffer layers as shown in FIG. 3, while people skilled in the art may also combine the two afore-described techniques that can still implement the embodiments, although the disclosure is not limited thereto. Referring to FIG. 4, the nitride semiconductor structure 400 of the embodiment is similar to the nitride semiconductor structure 300 depicted in FIG. 3, except the heights of the island structures I in the sub-buffer layers 431-433 of the buffer layer 430 are further arranged to satisfy a certain relationship. Specifically, in the nitride semiconductor structure 400, the first through third sub-buffer layers 431-433 in the buffer layer 430 are deposited on the nucleation layer 120 in sequence. The island structures I in each of the sub-buffer layers 431-433 can be formed through different epitaxial growth rates, so that the heights of the island structures I in the sub-buffer layers 431-433 have various heights H1, H2 and H3, respectively. In the embodiment, the heights of the island structures I in the first through third sub-buffer layers 431-433 of the buffer layer 430 decrease gradually in a layer thickness direction from the nucleation layer 120 toward the nitride semiconductor layer 140, namely, H1>H2>H3. In other words, in the n sub-buffer layers of the buffer layer (as shown in FIG. 1), the height H1 of the island structures I in the first sub-buffer layer 131, the height H2 of the island structures I in the second sub-buffer layer 132 and the height Hn of the island structures I in the n$^{th}$ sub-buffer layer satisfy the following equation (2):

$$H1>H2>Hn \qquad (2).$$

More specifically, the heights of the island structures I in the first sub-buffer layers 431 may be in a range from 70 nm to 40 nm, the heights of the island structures I in the first sub-buffer layers 432 may be in a range from 50 nm to 20 nm, and the heights of the island structures I in the first sub-buffer layers 433 may be in a range from 30 nm to 5 nm.

Figure 5:
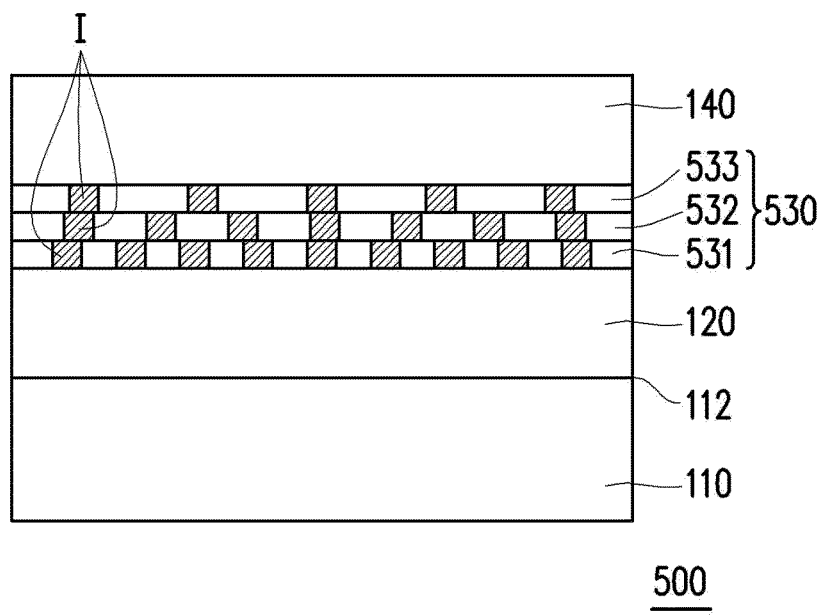
FIG. 5 is a schematic diagram illustrating a buffer layer having island structures with different distribution densities in a nitride semiconductor structure according to an exemplary embodiment.

FIG. 5 is a schematic diagram illustrating a buffer layer having island structures with different distribution densities in a nitride semiconductor structure according to an exemplary embodiment. In the embodiment, having distribution densities of the island structures in the sub-buffer layers to satisfy a certain relationship can be employed to replace the technique of the graded roughnesses (i.e., R1-R3) in the sub-buffer layers as shown in FIG. 3, while people skilled in the art may also combine the two afore-described techniques that can still implement the embodiments, although the disclosure is not limited thereto.

Referring to FIG. 5, the nitride semiconductor structure 500 of the embodiment is similar to the nitride semiconductor structure 300 depicted in FIG. 3, except the distribution densities of the island structures I in the sub-buffer layers 531-533 of the buffer layer 530 are further arranged to satisfy a certain relationship. Specifically, in the nitride semiconductor structure 500, the first through third sub-buffer layers 531-533 in the buffer layer 530 are deposited on the nucleation layer 120 in sequence. The island structures I in each of the sub-buffer layers 531-533 are formed through different epitaxial growth rates, and the island structures I in the sub-buffer layers 531-533 have various distribution densities D1, D2 and D3, respectively. In the embodiment, the distribution densities of the island structures I in the first through third sub-buffer layers 531-533 of the buffer layer 530 decrease gradually in a layer thickness direction from the nucleation layer 120 toward the nitride semiconductor layer 140, namely, D1>D2>D3.

In other words, in the n sub-buffer layers of the buffer layer (as shown in FIG. 1), the distribution density D1 of the island structures I in the first sub-buffer layer 131, the distribution density D2 of the island structures I in the second sub-buffer layer 132 and the distribution density Dn of the island structures I in the $n^{th}$ sub-buffer layer satisfy the following equation (3):

$$D1 > D2 > Dn \quad (3).$$

More specifically, the distribution densities D1 of the island structures I in the first sub-buffer layer 531 may be in a range from $1 \times 10^{-11}$ cm$^{-2}$ to $1 \times 10^{-9}$ cm$^{-2}$, the distribution densities D2 of the island structures I in the second sub-buffer layer 532 may be in a range from $5 \times 10^{-10}$ cm$^{-2}$ to $5 \times 10^{-8}$ cm$^{-2}$, and the distribution densities D3 of the island structures I in the third sub-buffer layer 533 may be in a range from $5 \times 10^{-9}$ cm$^{-2}$ to $5 \times 10^{-7}$ cm$^{-2}$.

The impact on the defect density (such as cracks) resulting from the difference in roughnesses of the sub-buffer layers or heights/distribution densities of the island structures in the sub-buffer layers of the buffer layer in the nitride semiconductor structure may be derived from the variations described in FIG. 3, FIG. 4 and FIG. 5.

According to the present embodiment, it is assumed that the buffer layer of the nitride semiconductor structure has three sub-buffer layers with island structures, in which the buffer layer may have a step graded aluminum content or a continuously graded aluminum content, and the distribution of the island structures in the first sub-buffer layer is graded to the distribution of the island structures in the third sub-buffer layer. On these conditions, by employing any one of the afore-described techniques (i.e., the roughness of the sub-buffer layers, the height or the distribution density of the island structures in the sub-buffer layers satisfying the certain relationship, as illustrated in FIG. 3 through FIG. 5), the improvement effect of the defect density is especially pronounced when the number of the sub-buffer layers with the island structures gradually increases in the buffer layer of the nitride semiconductor structure.

Figure 6:
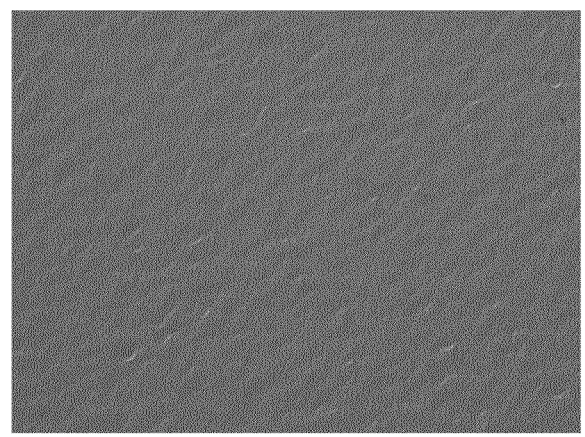
FIG. 6 shows an OM image of a surface of a nitride semiconductor layer in a nitride semiconductor structure.

FIG. 6 shows an OM image of a surface of a nitride semiconductor layer in a nitride semiconductor structure. In detail, FIG. 6 shows the OM image of a top surface of the nitride semiconductor layer in the nitride semiconductor structure, with a zoom-in rate of the optical microscope being 1000×.

Taking the buffer layer 330 of the nitride semiconductor structure 300 depicted in FIG. 3 by satisfying any one of the afore-described relationships (i.e., equation (1), (2) or (3)) as an example, when the buffer layer 330 is composed of the three sub-buffer layers 331-333 having the island structures, no crack is formed on the top surface of the nitride semiconductor layer 140, as shown in FIG. 6. The top surface of the nitride semiconductor layer 140 appears to be a smooth and crack-free surface. Consequently, it can be deduced that the stresses resulted from thermal expansion mismatch and lattice mismatch between the nitride semiconductor layer 140 and the silicon substrate 110 can be effectively reduced through the sub-buffer layers 331-333 having the island structures therebetween, and the cracks in the nitride semiconductor layer 140 may be eliminated with the afore-described sub-buffer layers in the buffer layer 330, thereby improving the quality of the nitride semiconductor layer 140 and decreasing the probability of cracks occurring in the nitride semiconductor structure 300.

Figure 7A:
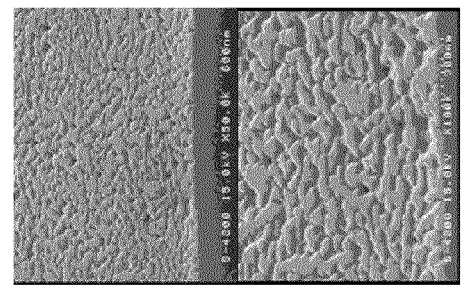
FIG. 7A through FIG. 7D show SEM images of surfaces of a last sub-buffer layer in the buffer layer and a nitride semiconductor layer of a nitride semiconductor structure, respectively.
Figure 7B:
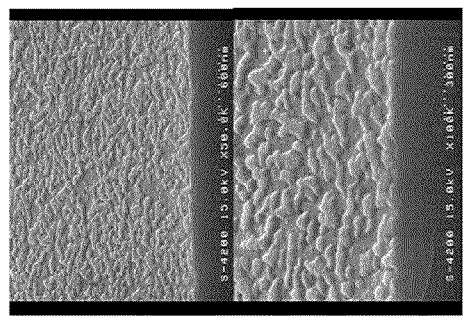
Figure 7C:
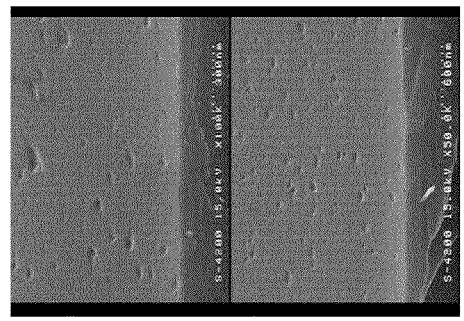
Figure 7D:

Moreover, FIG. 7A through FIG. 7D show SEM images of surfaces of a last sub-buffer layer in the buffer layer and a nitride semiconductor layer of a nitride semiconductor structure, respectively. In detail, FIG. 7A shows the SEM images of a top surface of the first sub-buffer layer in the buffer layer, FIG. 7B shows the SEM images of a top surface of the second sub-buffer layer in the buffer layer, FIG. 7C shows the SEM images of a top surface of the third sub-buffer layer in the buffer layer, with the zoom-in rates of SEM being 50K and 1000K, in which the top SEM images of FIG. 7A through FIG. 7C are taken under the zoom-in rate of SEM being 50K, whereas the bottom SEM images of FIG. 7A through FIG. 7C are taken under the zoom-in rate of SEM being 1000K. Furthermore, FIG. 7D shows the SEM image of a top surface of the nitride semiconductor layer in the nitride semiconductor structure, with the zoom-in rate of SEM being 50K.

Similarly, as described above, the buffer layer 330 of the nitride semiconductor structure 300 depicted in FIG. 3 by satisfying any one of the afore-described relationships (i.e., equation (1), (2) or (3)) is taken as an example. When the number of the sub-buffer layers gradually increases in the buffer layer 330, the roughness on the top surface of the last stacked sub-buffer layer has significantly decreased as shown in FIG. 7A through FIG. 7C. Moreover, as shown in FIG. 7D, when the buffer layer 330 is composed of the three sub-buffer layers 331-333 having the island structures I, the top surface of the nitride semiconductor layer 140 appears to be a smooth and crack-free surface. Consequently, it can be deduced that the surface of the nitride semiconductor structure 300 becomes smoother and less cracks are occurred thereon through employing the sub-buffer layers 331-333 having the various island structures. In other words, when the sub-buffer layers 331-333 are sequentially deposited to form the buffer layer 330 at high temperature, there may be interspaces existed between the layers during the deposition. Consequently, the stresses on the nitride semiconductor structure 300 can be released via these interspaces during cooling, thereby lowering the stresses resulted from thermal expansion mismatch and lattice mismatch between the nitride semiconductor layer 140 and the silicon substrate 110.

The impact on the probability of cracks occurring results from the number of the sub-buffer layers 331-333 in the buffer layer 330 of the nitride semiconductor structure 300, which is further illustrated below.

Table 1 records the root mean square roughness (RMS) results under different number of the sub-buffer layers 331-333 in the buffer layer 330 by satisfying any one of the afore-described relationships (i.e., equation (1), (2) or (3)). Table 1 also records the average epitaxial growth rates of the sub-buffer layers 331-333 (such as the aluminum gallium nitride layers with different aluminum contents) and the nitride semiconductor layer 140 (such as the gallium nitride layer), and the average thickness of the last stacked sub-buffer layer being deposited in the nitride semiconductor structure 300, respectively. Moreover, FIG. 8 is a schematic diagram showing an X-ray diffraction (XRD) analysis of the nitride semiconductor structure depicted in FIG. 3, in which the nitride semiconductor structure 300 includes the three sub-buffer layers 331-333.

TABLE 1

|  | first sub-buffer layer 331 | second sub-buffer layer 332 | third sub-buffer layer 333 | nitride semiconductor layer 140 (GaN) |
| --- | --- | --- | --- | --- |
| Root mean square roughness (RMS) (nm) | 4.72 | 4.70 | 1.52 | 0.226 |
| Average thickness (nm) | 46.43 | 24.19 | 15.90 | 1.746 |
| Average Growth rate (μm/hr) | 0.9 | 0.9 | 1.0 | 1.1 |

Figure 8:
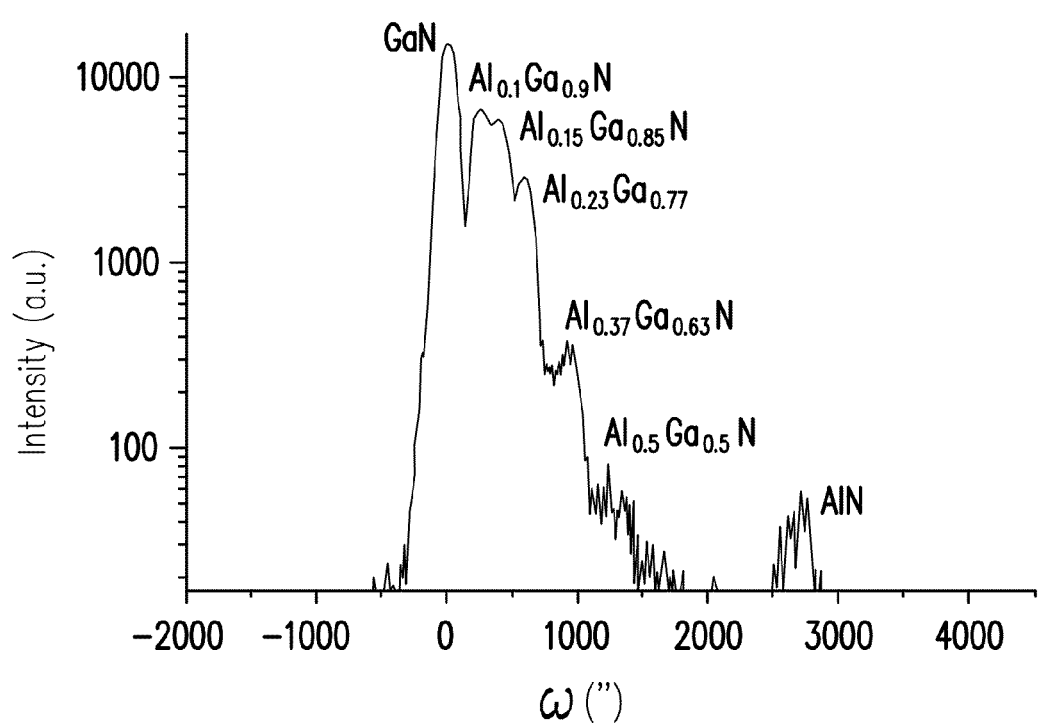
FIG. 8 is a schematic diagram showing an X-ray diffraction (XRD) analysis of the nitride semiconductor structure depicted in FIG. 3.

As shown in the results of Table 1 and FIG. 8, the aluminum content among the sub-buffer layers decreases stepwisely from the nucleation layer 120 (as the AlN layer shown in FIG. 8) towards the nitride semiconductor layer 140 (as the GaN layer shown in FIG. 8), such as 0.5 at %, 0.37 at %, 0.23 at %, 0.15 at %, and 0.1 at %. The overall RMS values of the surface roughness on the first, second and third sub-buffer layers 331, 332, 333 are measured as 4.72 nm, 4.70 nm and 1.52 nm, while the overall RMS value of the nitride semiconductor layer 140 is measured as 0.226 nm. On the other hand, the average thicknesses of the sub-buffer layers 331-333 and the nitride semiconductor layer 140 also decreases stepwisely from 46.43 nm, 24.19 nm, 15.90 nm to 1.746 nm, namely, the thickness of the first sub-buffer layer 331 closest to the nucleation layer 120 is greater than the thickness of the third sub-buffer layer 333 closest to the nitride semiconductor layer 140.

Both the overall RMS value and the average thickness of the last sub-buffer layer deposited in the buffer layer 330 are decreased when the number of sub-buffer layers gradually increases in the buffer layer 330. Specifically, as the number of sub-buffer layers increases in the buffer layer 330, together with the aluminum content of the buffer layer 330 being gradually decreased in a layer thickness direction from the nucleation layer 120 toward the nitride semiconductor layer 140 (which implies the lattice constant of the sub-buffer layer is became greater as the aluminum content decreases and a preferable crystalline quality is obtained) and the height and/or distribution density of the island structures in each of the sub-buffer layers being varied individually, voids or cracks barely occur on the nitride semiconductor structure 300 in the embodiment, as shown in FIG. 7A through FIG. 7D.

In other words, according to the experimental results described above (as shown in Table 1 and FIG. 7A-FIG. 7D), it can be deduced that the stresses resulted from thermal expansion mismatch and lattice mismatch between the nitride semiconductor layer 140 and the silicon substrate 110 in the nitride semiconductor structure 300 of the embodiment can be effectively reduced through depositing more various island structures to form into the sub-buffer layers 331-333 in the buffer layer 330 in which the distribution of the island structures in the first sub-buffer layer 331 is graded to the distribution of the island structures in the third sub-buffer layer 333, for instance. Thereby, the probability of pits or cracks occurring on the nitride semiconductor structure can be decreased. As such, the disclosure is capable of fabricating a large-sized and higher quality nitride semiconductor structure to be applied to fields such as light-emitting diodes or power devices.

In the disclosure below, the effect that the buffer layer formed by the sub-buffer layers having island structures has on the nitride semiconductor layer of the nitride semiconductor structure is further discussed.

Figure 9:
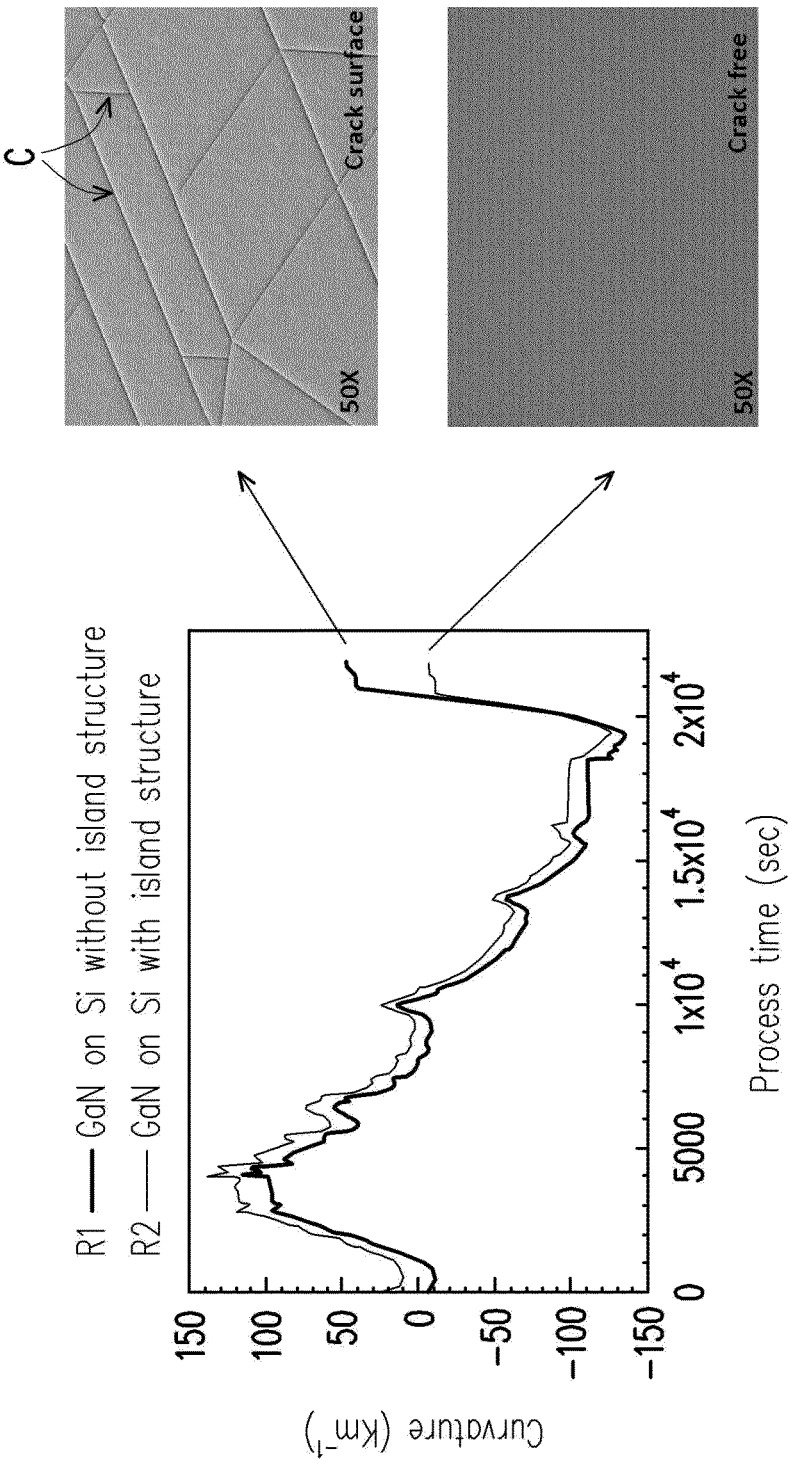
FIG. 9 is a schematic diagram illustrating the effect of island structures on a nitride semiconductor structure.

FIG. 9 is a schematic diagram illustrating the effect of island structure on a nitride semiconductor structure. Here, the buffer layer 330 including three sub-buffer layers 331-333 depicted in FIG. 3 is taken as an illustration, in which the aluminum contents stacked alternately in the buffer layer 330 may be decreased stepwisely or continuously from the nucleation layer 120 towards the nitride semiconductor layer 140, and the roughnesses of the sub-buffer layers 331-333, or the heights and/or the distribution densities of the island structures in the sub-buffer layers 331-333 of the buffer layer 330 may satisfy certain relationships (i.e., the relationships in Equations (1)-(3)). Referring to FIG. 9, the horizontal axis represents the process time (unit: sec), and the vertical axis represents the epitaxial curvature of the nitride semiconductor layer 140 (unit: $Km^{-1}$). In addition, FIG. 9 also shows two OM images respectively illustrating a surface of the nitride semiconductor layer 140 in both of the nitride semiconductor structures with and without the island structures.

To be specific, FIG. 9 shows the relationships between the process time and the epitaxial curvature of the nitride semiconductor layer 140 in both of the nitride semiconductor structures with and without the island structures, in which the line R1 represents the epitaxial curvature of the nitride semiconductor layer 140 disposed on the silicon substrate 110 without island structures, and the line R2 represents the epitaxial curvature of the nitride semiconductor layer 140 disposed on the silicon substrate 110 with the afore-described island structures in the sub-buffer layers 331-333 of the buffer layer 330. The epitaxial curvatures of the nitride semiconductor layers, with and without the afore-described island structures, are measured in an in-situ manner.

Referring to FIG. 9, during a process time of between $1.9 \times 10^4$ sec and $2.0 \times 10^4$ sec, the nitride semiconductor structure begins to lower the temperature and both R1, R2 also start to climb rapidly. During a process time of between $2.1 \times 10^4$ sec and $2.2 \times 10^4$ sec, R2 almost reaches zero epitaxial curvature whereas R1 climbs further up to $40\,Km^{-1}$. In other words, during cooling the nitride semiconductor structures with and without the island structures, both the nitride semiconductor layers being curved by the stresses resulted from thermal expansion mismatch may return to their original forms due to contraction. Under the constitution that the nitride semiconductor layer 140 disposed on the silicon substrate 110 with the island structures, the island structures in the sub-buffer layers 331-333 are capable of relieving the warping condition of the nitride semiconductor structure 300, such that the nitride semiconductor structure 300 may maintain as a relatively flat structure, as indicated by R2 having zero epitaxial curvature in FIG. 9.

On the other hand, under the constitution that the nitride semiconductor layer 140 disposed on the silicon substrate 110 without the afore-described island structures, the warping condition of the nitride semiconductor structure 300 cannot be compensated, so that the warping condition is worsen and cracks C occur when the warping condition reaches a certain degree, as indicated by R1 reaching to the epitaxial curvature of 40 Km$^{-1}$ in FIG. 9.

Consequently, the results are respectively shown in the two OM images with a zoom-in rate of the optical microscope being 50×, that is, the surface of the nitride semiconductor layer 140 in the nitride semiconductor structure 300 without the island structures is a cracked surface (as the cracks C shown in the top OM image of FIG. 9) whereas the surface of the nitride semiconductor layer 140 in the nitride semiconductor structure with the island structures is a crack-free surface.

According to the experimental results described above, it can be further established that the stresses within the nitride semiconductor structure can be reduced and the probability of pits or cracks occurring in the nitride semiconductor structure after cooling can also be decreased by employing the buffer layer that is composed of the sub-buffer layers having island structures between the nitride semiconductor layer and the silicon substrate.

In view of the foregoing, in the nitride semiconductor structure according to the embodiments of the disclosure, by having the roughnesses of the sub-buffer layers in the buffer layer satisfying a specific relationship, or by having the heights and/or the distribution densities of the island structures in the sub-buffer layers of the buffer layer satisfying specific relationships, together with the buffer layer being a graded AlGaN layer having step graded aluminum content or continuously graded aluminum content, the stresses resulted from thermal expansion mismatch (i.e. difference between the coefficients of thermal expansion) can be effectively reduced between the nitride semiconductor layer and the silicon substrate. Moreover, the nitride semiconductor structure of the disclosure can avoid tedious processes such as laser ablation, which improves the yield rate of large-sized nitride semiconductor structures with no cracks.

Moreover, the nitride semiconductor structure of the disclosure has superiorities such as low cost, large size, high electrical conductivity and high thermal conductivity, and may be combined into optoelectronic integrated circuits with the highly mature silicon semiconductor industry, and may be applied to the field of light-emitting diodes. The light-emitting diode fabricated on the nitride semiconductor structure of the disclosure provides higher lumens/watt, enhanced color temperature, and higher color rendering index. If the process is specific for silicon wafers larger than 8 inches, the process of light-emitting diodes is compatible with the current automated semiconductor production line, and the cost is one tenth of that of sapphire substrates, effectively raising the cost-effectiveness of the light-emitting diode industry. Moreover, the nitride semiconductor structure of the disclosure can also be applied to other fields such as power devices.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A nitride semiconductor structure, comprising:
a silicon substrate;
a nucleation layer, disposed on the silicon substrate, wherein the silicon substrate comprises a surface in contact with the nucleation layer and a plurality of cavities, and the cavities are concave on the surface;
a buffer layer, disposed on the nucleation layer, wherein the buffer layer comprises n sub-buffer layers where n≥2, and each of the sub-buffer layers has island structures; and
a nitride semiconductor layer, disposed on the buffer layer.

2. The nitride semiconductor structure according to claim 1, wherein the buffer layer, counting from the nucleation layer, sequentially comprises a first sub-buffer layer, a second sub-buffer layer . . . , and an $n^{th}$ sub-buffer layer, and a distribution of the island structures in the first sub-buffer layer is graded to a distribution of the island structures in the $n^{th}$ sub-buffer layer.

3. The nitride semiconductor structure according to claim 2, wherein a roughness R1 of the first sub-buffer layer, a roughness R2 of the second sub-buffer layer and a roughness Rn of the $n^{th}$ sub-buffer layer satisfy the following equation (1):

$$R1>R2>Rn \tag{1}$$

4. The nitride semiconductor structure according to claim 2, wherein a height H1 of the island structures in the first sub-buffer layer, a height H2 of the island structures in the second sub-buffer layer and a height Hn of the island structures in the $n^{th}$ sub-buffer layer satisfy the following equation (2):

$$H1>H2>Hn \tag{2}$$

5. The nitride semiconductor structure according to claim 1, wherein the buffer layer, counting from the nucleation layer, sequentially comprises a first sub-buffer layer, a second sub-buffer layer and a third sub-buffer layer, and a composition of the sub-buffer layers comprises aluminum gallium nitride ($Al_xGa_yN$, x+y=1).

6. A nitride semiconductor structure, comprising:
a silicon substrate;
a nucleation layer, disposed on the silicon substrate;
a buffer layer, disposed on the nucleation layer, wherein the buffer layer comprises n sub-buffer layers where n≥2, each of the sub-buffer layers has island structures, at least one of the sub-buffer layers comprises a multi-layer structure, and the multi-layer structure comprises a plurality of stacked nitride layers with different lattice constants; and
a nitride semiconductor layer, disposed on the buffer layer.

7. The nitride semiconductor structure according to claim 6, wherein the buffer layer, counting from the nucleation layer, sequentially comprises a first sub-buffer layer, a second sub-buffer layer . . . , and an $n^{th}$ sub-buffer layer, and a distribution of the island structures in the first sub-buffer layer is graded to a distribution of the island structures in the $n^{th}$ sub-buffer layer.

8. The nitride semiconductor structure according to claim 7, wherein a roughness R1 of the first sub-buffer layer, a roughness R2 of the second sub-buffer layer and a roughness Rn of the $n^{th}$ sub-buffer layer satisfy the following equation (1):

$$R1>R2>Rn \tag{1}$$

9. The nitride semiconductor structure according to claim 7, wherein a height H1 of the island structures in the first sub-buffer layer, a height H2 of the island structures in the second sub-buffer layer and a height Hn of the island structures in the $n^{th}$ sub-buffer layer satisfy the following equation (2):

$$H1>H2>Hn \qquad (2).$$

10. The nitride semiconductor structure according to claim 6, wherein the buffer layer, counting from the nucleation layer, sequentially comprises a first sub-buffer layer, a second sub-buffer layer and a third sub-buffer layer, and a composition of the sub-buffer layers comprises aluminum gallium nitride (Al$_x$Ga$_y$N, x+y=1).

11. A nitride semiconductor structure, comprising:
a silicon substrate;
a nucleation layer, disposed on the silicon substrate;
a buffer layer, disposed on the nucleation layer, wherein the buffer layer, counting from the nucleation layer, sequentially comprises a first sub-buffer layer, a second sub-buffer layer . . . , and an $n^{th}$ sub-buffer layer, each of the sub-buffer layers has island structures and a distribution of the island structures in the first sub-buffer layer is graded to a distribution of the island structures in the $n^{th}$ sub-buffer layer such that a distribution density D1 of the island structures in the first sub-buffer layer, a distribution density D2 of the island structures in the second sub-buffer layer and a distribution density Dn of the island structures in the $n^{th}$ sub-buffer layer satisfy the following equation (3):

$$D1>D2>Dn \qquad (3); and$$

a nitride semiconductor layer, disposed on the buffer layer.

12. The nitride semiconductor structure according to claim 11, wherein a roughness R1 of the first sub-buffer layer, a roughness R2 of the second sub-buffer layer and a roughness Rn of the $n^{th}$ sub-buffer layer satisfy the following equation (1):

$$R1>R2>Rn \qquad (1).$$

13. The nitride semiconductor structure according to claim 11, wherein a height H1 of the island structures in the first sub-buffer layer, a height H2 of the island structures in the second sub-buffer layer and a height Hn of the island structures in the $n^{th}$ sub-buffer layer satisfy the following equation (2):

$$H1>H2>Hn \qquad (2).$$

14. The nitride semiconductor structure according to claim 11, wherein a composition of the sub-buffer layers comprises aluminum gallium nitride (Al$_x$Ga$_y$N, x+y=1).

* * * * *